(12) United States Patent
Deguchi

(10) Patent No.: US 7,077,916 B2
(45) Date of Patent: Jul. 18, 2006

(54) SUBSTRATE CLEANING METHOD AND CLEANING APPARATUS

(75) Inventor: Yasuyuki Deguchi, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/382,584

(22) Filed: Mar. 7, 2003

(65) Prior Publication Data
US 2003/0168078 A1   Sep. 11, 2003

(30) Foreign Application Priority Data
Mar. 11, 2002   (JP) ............... 2002-064905

(51) Int. Cl.
*B08B 7/00* (2006.01)

(52) U.S. Cl. .............. 134/33; 134/1; 134/1.3; 134/32; 134/34; 134/184; 134/187; 134/198; 438/906

(58) Field of Classification Search .......... 134/1, 134/26, 32, 33, 34, 902, 1.3, 184, 187, 198; 438/906
See application file for complete search history.

(56) References Cited

U.S. PATENT DOCUMENTS

| | | | | |
|---|---|---|---|---|
| 5,562,778 A | * | 10/1996 | Koretsky et al. | 134/1 |
| 5,785,068 A | * | 7/1998 | Sasaki et al. | 134/144 |
| 5,980,647 A | * | 11/1999 | Buker et al. | 134/33 |
| 6,003,527 A | * | 12/1999 | Netsu et al. | 134/1.3 |
| 6,367,490 B1 | * | 4/2002 | Namba | 134/95.3 |
| 6,494,985 B1 | * | 12/2002 | Sotozaki et al. | 156/345.12 |
| 6,583,071 B1 | * | 6/2003 | Weidman et al. | 438/787 |
| 6,638,366 B1 | * | 10/2003 | Lammert et al. | 134/33 |
| 6,643,882 B1 | * | 11/2003 | Sotozaki et al. | 15/77 |
| 6,730,176 B1 | * | 5/2004 | Kuyel | 134/1 |
| 6,748,961 B1 | * | 6/2004 | Treur | 134/148 |
| 2001/0024767 A1 | * | 9/2001 | Toshima et al. | 430/313 |
| 2002/0035762 A1 | * | 3/2002 | Okuda et al. | 15/77 |

FOREIGN PATENT DOCUMENTS

| JP | 8-318235 | 12/1996 |
|---|---|---|
| JP | 2001-7067 | 1/2001 |

* cited by examiner

*Primary Examiner*—M. Kornakov
(74) *Attorney, Agent, or Firm*—McDermott Will & Emery LLP

(57) ABSTRACT

A substrate is cleaned by supplying an ultrasonically-agitated cleaning liquid onto the substrate from a nozzle provided above the substrate while spinning the substrate. The substrate being cleaned is spun at a rotational speed of 2600 rpm or more and 3500 rpm or less, or at a rotational speed of 260×V/D (rpm) or more and 350×V/D (rpm) or less, where D (mm) is a diameter of the nozzle and V (mm/sec) is a moving velocity of the nozzle.

13 Claims, 7 Drawing Sheets

SUBSTRATE CLEANING METHOD AND CLEANING APPARATUS

BACKGROUND OF THE INVENTION

The present invention relates to a substrate cleaning method and a cleaning apparatus for cleaning a substrate using an ultrasonically-agitated cleaning liquid being supplied to the substrate surface, without using a brush, or the like, contacted with the substrate surface.

For cleaning the surface of a substrate, there is a physical cleaning method in which a cleaning liquid such as pure water that is ultrasonically vibrated is supplied to the substrate surface. The cleaning method, which utilizes the cavitation phenomenon, has been used primarily in steps where a chemical cleaning cannot be used, e.g., in a cleaning step subsequent to the formation of metal wiring.

As electronic devices are miniaturized, there is a need to remove more minute contaminant particles and/or to perform the cleaning process without damaging the device. In order to meet the need, various apparatuses have been developed, including those that perform a cleaning process while an ultrasonic wave having a high frequency on the order of 1 MHz is applied to the cleaning liquid, and those with which the power of the ultrasonic wave to be applied to the cleaning liquid (hereinafter referred to as "ultrasonic output") can be controlled within a low power range from some tens of watts to some hundreds of watts.

FIG. 14 is a schematic cross-sectional view illustrating a conventional ultrasonic cleaning apparatus (an apparatus that cleans the substrate surface by supplying an ultrasonically-vibrated cleaning liquid thereto).

As illustrated in FIG. 14, a substrate 101 is held by a vacuum chuck 102. The vacuum chuck 102 is spun by a motor 103. The substrate 101, the vacuum chuck 102 and the motor 103 are housed in an open-top cup 104. A nozzle arm 105 is provided outside the cup 104. The tip of the nozzle arm 105 is located above the substrate 101 within the cup 104. Moreover, an ultrasonic nozzle 106 for discharging a supplied cleaning liquid such as pure water toward the substrate 101 is provided at the tip of the nozzle arm 105. The ultrasonic nozzle 106 includes therein an RF vibrator 108 that is vibrated by an RF generator 107. Thus, the ultrasonic nozzle 106 can discharge the cleaning liquid such as pure water while ultrasonically vibrating the cleaning liquid.

FIG. 15 is a schematic plan view illustrating the scanning range of the ultrasonic nozzle 106 in the conventional ultrasonic cleaning apparatus illustrated in FIG. 14.

As illustrated in FIG. 15, a scanning range 109 of the ultrasonic nozzle 106 is set so as to extend in the radial direction between an edge position (a point along the periphery) 110 and a center 111 of the substrate 101 (being held by the vacuum chuck 102), which is a wafer. Thus, the ultrasonic nozzle 106 is reciprocated above the substrate 101 between the edge position 110 and the center 111.

FIG. 16 is a diagram illustrating a cleaning sequence using the conventional ultrasonic cleaning apparatus illustrated in FIG. 14.

The ultrasonic cleaning process is performed by supplying ultrasonically-vibrated pure water onto the surface of the substrate 101 from the ultrasonic nozzle 106 having a cleaning nozzle diameter of 4 mm while spinning the substrate 101 with the motor 103 at a rotational speed of 1000 rpm, as illustrated in FIG. 16. By using the nozzle arm 105, the ultrasonic nozzle 106 is reciprocated in the radial direction of the substrate 101 at a velocity of 40 mm/sec across the scanning range 109. In this way, the cleaning spiral pitch (the distance between the start and the end of a single turn in the spiral trace of the nozzle (the trace as viewed from the spinning substrate)) is sufficiently smaller than the cleaning nozzle diameter, thereby ensuring that the entire surface of the substrate 101 is cleaned with ultrasonically-vibrated pure water. Moreover, after the ultrasonic cleaning, the supply of pure water from the ultrasonic nozzle 106 is stopped, and the substrate 101 is spun by the motor 103 at a rotational speed of 4000 rpm to dry the substrate 101, as illustrated in FIG. 16. A cleaning method as described above is disclosed in Japanese Laid-Open Patent Publication No. 08-318235, for example.

With the conventional substrate cleaning method described above, the cleaning spiral pitch can be set to be smaller than the cleaning nozzle diameter, thereby suppressing the non-uniformity in the cleaning effect, by setting the substrate rotational speed to 1000 rpm, for example. However, the capacity for removing contaminant from the substrate is limited, and a sufficient contaminant removal rate cannot be achieved. In order to improve the contaminant removal rate, another method is proposed in the art, in which the number of times the substrate is scanned by the cleaning nozzle is increased. With this method, however, the cleaning time increases, thereby decreasing the device manufacturing capacity. In still another method proposed in the art, the contaminant removal rate is improved by increasing the ultrasonic output. With this method, however, the device may be damaged.

SUMMARY OF THE INVENTION

The present invention has been made in view of the above, and has an object to solve the problems associated with the conventional substrate cleaning processes that take into consideration only the problem of the non-uniformity in the cleaning effect, and to realize a substrate cleaning process that achieves a high contaminant removal rate while avoiding a decrease in the manufacturing capacity and a damage to the device.

In order to achieve the object set forth above, a first substrate cleaning method according to the present invention is a substrate cleaning method for cleaning a substrate by supplying an ultrasonically-agitated cleaning liquid onto the substrate from a nozzle provided above the substrate while spinning the substrate, wherein the substrate being cleaned is spun at a rotational speed of 2600 rpm or more and 3500 rpm or less.

According to the first substrate cleaning method, the substrate being ultrasonically cleaned is spun at a rotational speed of 2600 rpm or more and 3500 rpm or less. Specifically, the cleaning process is performed by supplying an ultrasonically-agitated cleaning liquid from the nozzle onto the substrate while spinning the substrate at a rotational speed that is considerably greater than that of the conventional process, which is on the order of 100 rpm. This gives the following effect. The ultrasonic vibrations, which are applied vertically to the principal surface of the substrate by supplying the cleaning liquid from the nozzle, can be propagated along the principal surface of the substrate toward the periphery of the substrate by virtue of a strong centrifugal force. Thus, the contaminant on the substrate can be washed off the substrate within a short period of time, without increasing the ultrasonic output power or the number of scans made by cleaning nozzle, whereby it is possible to achieve a high contaminant removal rate while avoiding a decrease in the manufacturing capacity and a damage to the device. Moreover, since the cleaning spiral pitch is further reduced as compared with that in a case where the conventional substrate rotational speed is used, a high contaminant removal rate can be achieved while further suppressing the number of scans made by the cleaning nozzle, i.e., while further reducing the cleaning time. Furthermore, by optimizing the ratio of the cleaning spiral pitch with respect to the cleaning nozzle diameter (specifically, by decreasing the ratio to be about 1/300 or less), it is possible to clean the entire substrate surface with the ultrasonically-vibrated cleaning liquid while maximally suppressing the non-uniformity in the cleaning effect, thereby maximizing the contaminant removal capacity.

Note that an ultrasonic wave as used herein refers to a sound wave having a frequency of 20 kHz or more. While the frequency of an ultrasonic wave to be applied to the cleaning liquid in the present invention is not limited to this range, the frequency of an ultrasonic wave to be applied to the cleaning liquid may be 1300 kHz or more and 1700 kHz or less, for example.

In the first substrate cleaning method, it is preferred that the substrate being cleaned is spun at a rotational speed of 2600 rpm or more and 3000 rpm or less.

In this way, it is possible to avoid situations where some contaminant particles are bounced by a cleaning cup, etc., back onto the substrate due to a high substrate rotational speed. Moreover, it is possible to suppress the drying of the substrate being cleaned.

In the first substrate cleaning method, it is preferred that while the cleaning liquid is supplied onto the substrate from the nozzle, another cleaning liquid is supplied to a central portion of the substrate from another fixed nozzle so as to prevent drying of the central portion of the substrate being cleaned.

In this way, it is possible to prevent the drying of the central portion of the substrate being cleaned, i.e., a decrease in the contaminant removal rate in the substrate central portion, due to a high substrate rotational speed. In other words, it is possible to ensure that the entire substrate surface is always being rinsed by the cleaning liquid supplied from the fixed nozzle, whereby the contaminant particles deposited on the central portion of the substrate can be reliably removed by the cleaning liquid. Therefore, it is possible to prevent a decrease in the contaminant removal rate in the substrate central portion and to realize a uniform cleaning effect across the entire substrate surface.

Note that the type of the cleaning liquid supplied from the ultrasonic cleaning nozzle may be the same as, or different from, the type of the cleaning liquid supplied from the fixed nozzle.

In the first substrate cleaning method, it is preferred that when the cleaning liquid is supplied from the nozzle onto the substrate, the nozzle is reciprocated above the substrate from an edge position of the substrate through a center of the substrate to a position that is past the center of the substrate by a predetermined distance.

In this way, the cleaning time per one scan by the ultrasonic cleaning nozzle is increased in the central portion of the substrate being cleaned, as compared with a case where the nozzle is reciprocated between the edge position and the center of the substrate. Thus, even in the substrate central portion where the revolution velocity (=rotational speed×distance from substrate center) is smaller than in the substrate peripheral portion, it is possible to increase the efficiency of moving the contaminant toward the periphery of the substrate (in the horizontal direction). Thus, it is possible to prevent a decrease in the contaminant removal rate in the substrate central portion and to realize a uniform cleaning effect across the entire surface of the substrate.

Moreover, in such a case, the following effect can be obtained by setting the predetermined distance (the overlap distance in the substrate central portion in the scanning range of the ultrasonic cleaning nozzle) to be 10 mm or more and 20 mm or less (or 10% or more and 20% or less of the radius of the wafer to be the substrate). That is, it is possible to suppress an increase in the cleaning time, i.e., a decrease in the device manufacturing capacity, as compared with a case where the contaminant removal rate is improved by increasing the number of scans made by the ultrasonic cleaning nozzle.

A second substrate cleaning method according to the present invention is a substrate cleaning method for cleaning a substrate by supplying an ultrasonically-agitated cleaning liquid onto the substrate from a nozzle provided above the substrate while spinning the substrate, wherein: when the cleaning liquid is supplied from the nozzle onto the substrate, the nozzle is reciprocated above the substrate; and the substrate being cleaned is spun at a rotational speed of 260×V/D (rpm) or more and 350×V/D (rpm) or less, where D (mm) is a diameter of the nozzle and V (mm/sec) is a moving velocity of the nozzle.

According to the second substrate cleaning method, the substrate being ultrasonically cleaned is spun at a rotational speed of 260×V/D (rpm) or more and 350×V/D (rpm) or less. Herein, D (mm) is the diameter of the ultrasonic cleaning nozzle, and V (mm/sec) is the moving velocity of the ultrasonic cleaning nozzle. Moreover, the moving velocity V may be, for example, the average velocity during the reciprocation, or the velocity (principal velocity) during uniform-motion portions of the reciprocation excluding the other portions near the turning points. The above range of the substrate rotational speed in the second substrate cleaning method coincides with the range of the substrate rotational speed (2600 rpm or more and 3500 rpm or less) in the first substrate cleaning method, when the nozzle diameter D is 4 mm and the nozzle moving velocity V is 40 mm/sec, for example. Thus, the ultrasonic vibrations, which are applied vertically to the principal surface of the substrate by supplying the cleaning liquid from the nozzle, can be propagated along the principal surface of the substrate toward the periphery of the substrate by virtue of a strong centrifugal force. Therefore, the contaminant on the substrate can be washed off the substrate within a short period of time, without increasing the ultrasonic output power or the number of scans made by cleaning nozzle, whereby it is possible to achieve a high contaminant removal rate while avoiding a decrease in the manufacturing capacity and a damage to the device. Moreover, since the cleaning spiral pitch is further reduced as compared with that in a case where the conventional substrate rotational speed is used, a high contaminant removal rate can be achieved while further suppressing the number of scans made by the cleaning nozzle, i.e., while further reducing the cleaning time. Furthermore, since the ratio of the cleaning spiral pitch (=nozzle moving velocity V/substrate rotational speed) with respect to the cleaning nozzle diameter is decreased to be 1/260 or less, i.e., since the ratio is optimized, it is possible to clean the entire substrate surface with the ultrasonically-vibrated cleaning liquid while maximally suppressing the non-uniformity in the cleaning effect, thereby maximizing the contaminant removal capacity.

In the second substrate cleaning method, it is preferred that the substrate being cleaned is spun at a rotational speed of 260×V/D (rpm) or more and 300×V/D (rpm) or less.

In this way, it is possible to avoid situations where some contaminant particles are bounced by a cleaning cup, etc., back onto the substrate due to a high substrate rotational speed. Moreover, it is possible to suppress the drying of the substrate being cleaned.

In the second substrate cleaning method, it is preferred that while the cleaning liquid is supplied onto the substrate from the nozzle, another cleaning liquid is supplied to a central portion of the substrate from another fixed nozzle so as to prevent drying of the central portion of the substrate being cleaned.

In this way, it is possible to prevent the drying of the central portion of the substrate being cleaned, i.e., a decrease in the contaminant removal rate in the substrate central portion, due to a high substrate rotational speed. In other words, it is possible to ensure that the entire substrate surface is always being rinsed by the cleaning liquid supplied from the fixed nozzle, whereby the contaminant particles deposited on the central portion of the substrate can be reliably removed by the cleaning liquid. Therefore, it is possible to prevent a decrease in the contaminant removal rate in the substrate central portion and to realize a uniform cleaning effect across the entire substrate surface.

Note that the type of the cleaning liquid supplied from the ultrasonic cleaning nozzle may be the same as, or different from, the type of the cleaning liquid supplied from the fixed nozzle.

In the second substrate cleaning method, it is preferred that the nozzle is reciprocated above the substrate from an edge position of the substrate through a center of the substrate to a position that is past the center of the substrate by a predetermined distance.

In this way, the cleaning time per one scan by the ultrasonic cleaning nozzle is increased in the central portion of the substrate being cleaned, as compared with a case where the nozzle is reciprocated between the edge position and the center of the substrate. Therefore, it is possible to increase the efficiency of moving the contaminant in the horizontal direction, even in the substrate central portion where the revolution velocity is smaller than in the substrate peripheral portion. Thus, it is possible to prevent a decrease in the contaminant removal rate in the substrate central portion and to realize a uniform cleaning effect across the entire surface of the substrate.

Moreover, in such a case, the following effect can be obtained by setting the predetermined distance to be 10 mm or more and 20 mm or less (or 10% or more and 20% or less of the radius of the wafer to be the substrate). That is, it is possible to suppress an increase in the cleaning time, i.e., a decrease in the device manufacturing capacity, as compared with a case where the contaminant removal rate is improved by increasing the number of scans made by the ultrasonic cleaning nozzle.

A third substrate cleaning method according to the present invention is a substrate cleaning method for cleaning a substrate by supplying an ultrasonically-agitated cleaning liquid onto the substrate from a nozzle provided above the substrate while spinning the substrate, wherein when the cleaning liquid is supplied from the nozzle onto the substrate, the nozzle is reciprocated above the substrate from an edge position of the substrate through a center of the substrate to a position that is past the center of the substrate by a predetermined distance.

According to the third substrate cleaning method, the cleaning time per one scan by the ultrasonic cleaning nozzle is increased in the central portion of the substrate being cleaned, as compared with a case where the nozzle is reciprocated between the edge position and the center of the substrate. Therefore, it is possible to increase the efficiency of moving the contaminant in the horizontal direction, even in the substrate central portion where the revolution velocity is smaller than in the substrate peripheral portion. Thus, it is possible to prevent a decrease in the contaminant removal rate in the substrate central portion and to realize a uniform cleaning effect across the entire surface of the substrate.

In the third substrate cleaning method, it is preferred that the predetermined distance is 10 mm or more and 20 mm or less.

In this way, it is possible to suppress an increase in the cleaning time, i.e., a decrease in the device manufacturing capacity, as compared with a case where the contaminant removal rate is improved by increasing the number of scans made by the ultrasonic cleaning nozzle.

In the third substrate cleaning method, it is preferred that the predetermined distance is 10% or more and 20% or less of a radius of a wafer to be the substrate.

In this way, it is possible to suppress an increase in the cleaning time, i.e., a decrease in the device manufacturing capacity, as compared with a case where the contaminant removal rate is improved by increasing the number of scans made by the ultrasonic cleaning nozzle.

A cleaning apparatus according to the present invention includes: a holding member for holding a substrate; a motor for spinning the holding member; and a nozzle for reciprocating above the substrate and supplying a cleaning liquid onto the substrate held by the holding member while ultrasonically agitating the cleaning liquid, wherein the substrate being cleaned is spun by the motor at a rotational speed of $260 \times V/D$ (rpm) or more and $350 \times V/D$ (rpm) or less, where D (mm) is a diameter of the nozzle and V (mm/sec) is a moving velocity of the nozzle.

Thus, the cleaning apparatus of the present invention is capable of carrying out the second substrate cleaning method, thereby obtaining the effects of the method.

It is preferred that the cleaning apparatus of the present invention further includes another fixed nozzle for supplying another cleaning liquid to a central portion of the substrate held by the holding member.

In this way, it is possible to prevent the drying of the central portion of the substrate being cleaned, i.e., a decrease in the contaminant removal rate in the substrate central portion, due to a high substrate rotational speed. In other words, it is possible to ensure that the entire substrate surface is always being rinsed by the cleaning liquid supplied from the fixed nozzle, whereby the contaminant particles deposited on the central portion of the substrate can be reliably removed by the cleaning liquid. Therefore, it is possible to prevent a decrease in the contaminant removal rate in the substrate central portion and to realize a uniform cleaning effect across the entire substrate surface.

Note that the type of the cleaning liquid supplied from the ultrasonic cleaning nozzle may be the same as, or different from, the type of the cleaning liquid supplied from the fixed nozzle.

In the cleaning apparatus of the present invention, it is preferred that the nozzle is reciprocated above the substrate from an edge position of the substrate through a center of the substrate to a position that is past the center of the substrate by a predetermined distance.

In this way, the cleaning time per one scan by the nozzle is increased in the central portion of the substrate being cleaned, as compared with a case where the ultrasonic cleaning nozzle is reciprocated between the edge position and the center of the substrate. Therefore, it is possible to increase the efficiency of moving the contaminant in the horizontal direction, even in the substrate central portion where the revolution velocity is smaller than in the substrate peripheral portion. Thus, it is possible to prevent a decrease in the contaminant removal rate in the substrate central portion and to realize a uniform cleaning effect across the entire surface of the substrate.

Moreover, in such a case, the following effect can be obtained by setting the predetermined distance to be 10 mm or more and 20 mm or less (or 10% or more and 20% or less of the radius of the wafer to be the substrate). That is, it is possible to suppress an increase in the cleaning time, i.e., a decrease in the device manufacturing capacity, as compared with a case where the contaminant removal rate is improved by increasing the number of scans made by the ultrasonic cleaning nozzle.

DETAILED DESCRIPTION OF THE INVENTION

FIRST EMBODIMENT

A substrate cleaning method and a cleaning apparatus according to the first embodiment of the present invention will now be described with reference to the drawings.

Figure 1:
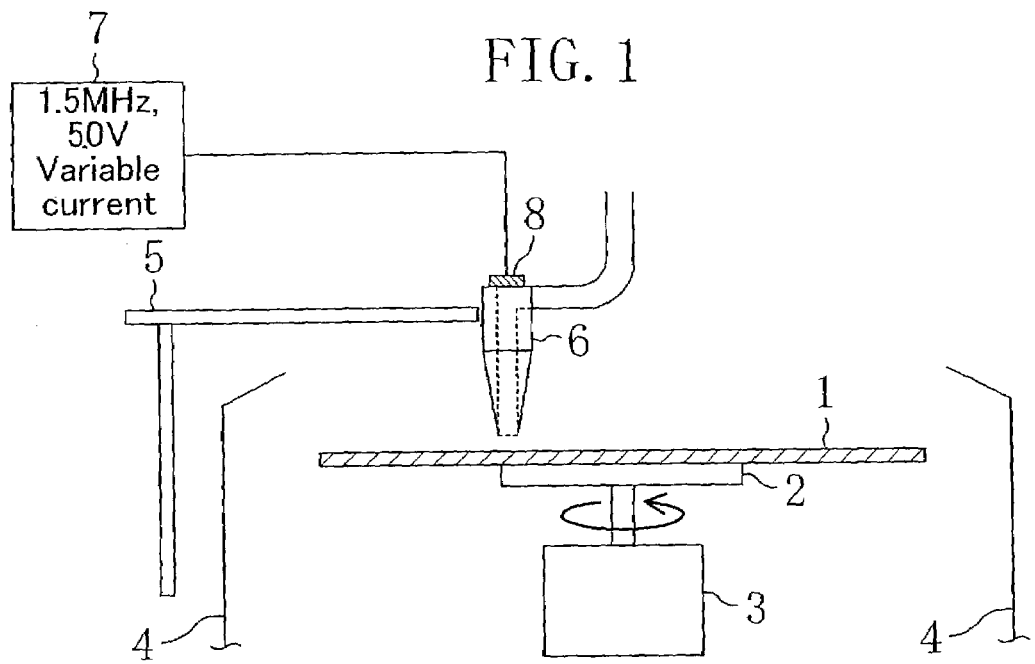
FIG. 1 is a schematic diagram illustrating the configuration of a cleaning apparatus according to a first embodiment of the present invention.

FIG. 1 is a schematic cross-sectional view illustrating a cleaning apparatus according to the first embodiment, which is an ultrasonic cleaning apparatus that cleans the substrate surface by supplying an ultrasonically-vibrated cleaning liquid thereto.

As illustrated in FIG. 1, a substrate 1 is held by a holding member (specifically, a vacuum chuck) 2. The vacuum chuck 2 is spun by a motor 3. The substrate 1, the vacuum chuck 2 and the motor 3 are housed in an open-top cup (housing) 4. A nozzle arm 5 is provided outside the cup 4. The tip of the nozzle arm 5 is located above the substrate 1 within the cup 4. Moreover, an ultrasonic nozzle 6 for discharging a supplied cleaning liquid such as pure water toward the substrate 1 is provided at the tip of the nozzle arm 5. An RF vibrator 8 that is vibrated by an RF generator 7 is attached to the ultrasonic nozzle 6. Thus, the ultrasonic nozzle 6 can discharge the cleaning liquid such as pure water while ultrasonically vibrating the cleaning liquid.

Figure 2:
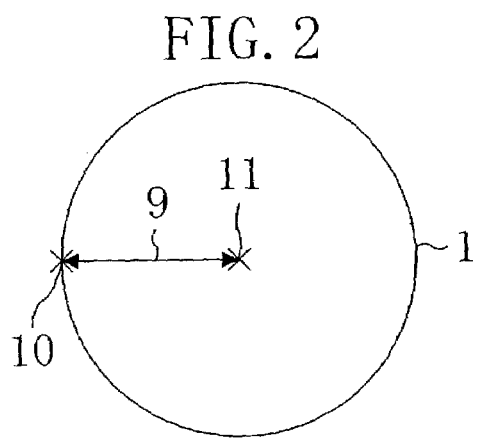
FIG. 2 is a schematic plan view illustrating the scanning range of an ultrasonic nozzle in the cleaning apparatus according to the first embodiment of the present invention.

FIG. 2 is a schematic plan view illustrating the scanning range of the ultrasonic nozzle 6 in the ultrasonic cleaning apparatus of the present embodiment illustrated in FIG. 1.

As illustrated in FIG. 2, a scanning range 9 of the ultrasonic nozzle 6 is set so as to extend in the radial direction between an edge position (a point along the periphery) 10 and a center 11 of the substrate 1 (being held by the vacuum chuck 2), which is a wafer. Thus, the ultrasonic nozzle 6 is reciprocated above the substrate 1 between the edge position 10 and the center 11.

A feature of the ultrasonic cleaning apparatus of the present embodiment is that the motor 3 spins the substrate 1 being cleaned at a rotational speed of 2600 rpm or more.

Figure 3:
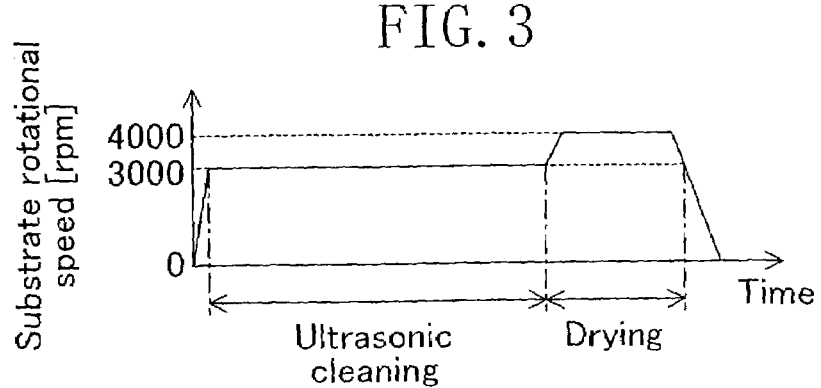
FIG. 3 is a diagram illustrating a cleaning sequence using the cleaning apparatus according to the first embodiment of the present invention.

FIG. 3 is a diagram illustrating a cleaning sequence using the ultrasonic cleaning apparatus of the present embodiment illustrated in FIG. 1.

The ultrasonic cleaning process is performed by supplying an ultrasonically-vibrated cleaning liquid, i.e., pure water, onto the surface of the substrate 1 from the ultrasonic nozzle 6 having a cleaning nozzle diameter of 4 mm, for example, while spinning the substrate 1 with the motor 3 at a rotational speed of 3000 rpm, for example, as illustrated in FIG. 3. By using the nozzle arm 5, the ultrasonic nozzle 6 is reciprocated in the radial direction of the substrate 1 at a velocity of 40 mm/sec, for example, across the scanning range 9 as described above. In this way, the cleaning spiral pitch (=nozzle moving velocity/substrate rotational speed) is sufficiently smaller than the cleaning nozzle diameter (specifically, the cleaning spiral pitch is 1/300 of the cleaning nozzle diameter), thereby ensuring that the entire surface of the substrate 1 is cleaned with ultrasonically-vibrated pure water. Moreover, since the cleaning spiral pitch is 1/3 of that in a case where the conventional substrate rotational speed, e.g., a rotational speed of 1000 rpm, is used, it is possible to reduce the number of scans made by the ultrasonic nozzle 6, thereby reducing the cleaning time, while realizing a contaminant removal rate that is equal to or greater than that obtained with the conventional process.

Moreover, after the ultrasonic cleaning, the supply of pure water from the ultrasonic nozzle 6 is stopped, and the substrate 1 is rotated by the motor 3 at a rotational speed of 4000 rpm, for example, to dry the substrate 1, as illustrated in FIG. 3.

Note that the moving velocity of the ultrasonic nozzle 6 may be, for example, the average velocity during the reciprocation of the ultrasonic nozzle 6, or the velocity (principal velocity) during uniform-motion portions of the reciprocation excluding the other portions near the turning points. Moreover, the ultrasonic nozzle 6 may be reciprocated above the substrate 1 between the edge position 10 and the center 11 while leaving a straight trace (see FIG. 2) or an arched trace, for example.

In order to confirm the advantage of the substrate cleaning process of the present embodiment using the cleaning apparatus illustrated in FIG. 1, the contaminant-removing effect (contaminant removal rate) was measured while varying four parameters (the flow rate of the cleaning liquid, the distance between the nozzle and the substrate (wafer), the output current value of an RF generator, and the substrate rotational speed) so as to evaluate the influence of these parameters. The results of the evaluation will now be described. Note that the output frequency and the output voltage value of the RF generator 7 are fixed respectively to 1.5 MHz and 50 V, for example, whereas the output current value of the RF generator 7 is variable in the range of 0.4 to 1.0 A. The contaminant removal rate was evaluated by cleaning the substrate 1 with, for example, about 4000 to 5000 silicon particles deposited thereon, and then measuring the silicon particle count on the cleaned substrate 1 so as to calculate the particle removal rate (%).

Figure 4:
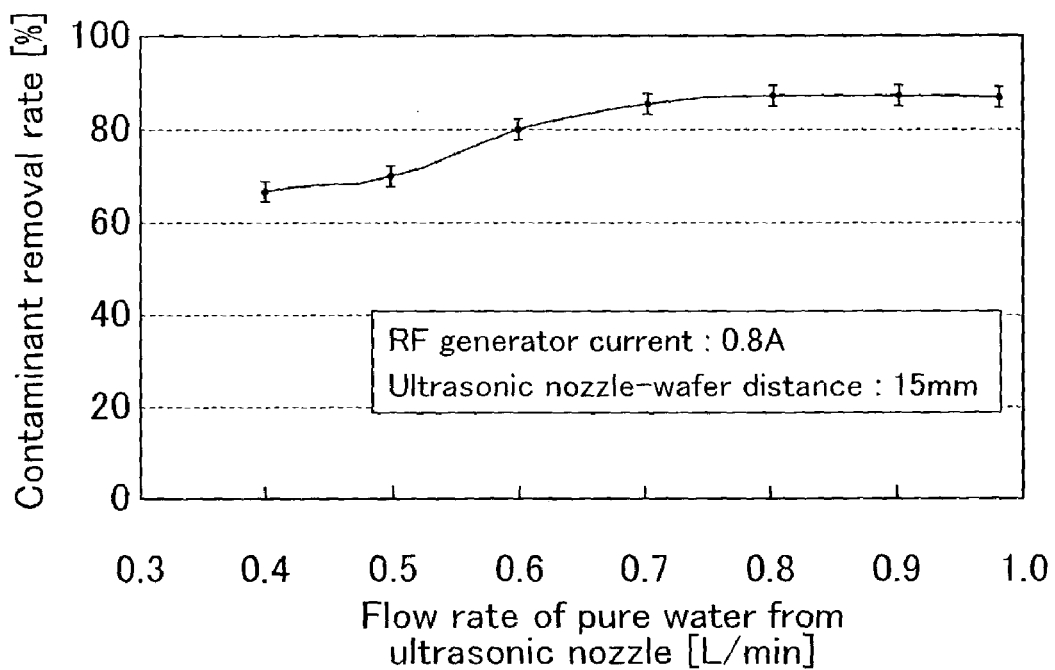
FIG. 4 is a graph illustrating the contaminant removal rate with respect to the flow rate of pure water supplied from the ultrasonic nozzle in a substrate cleaning process using the cleaning apparatus according to the first embodiment of the present invention.

FIG. 4 is a graph illustrating the contaminant removal rate with respect to the flow rate of the cleaning liquid, i.e., the flow rate of pure water supplied from the ultrasonic nozzle 6 to the substrate 1. As to parameters other than the flow rate of the cleaning liquid, the output current value of the RF generator 7 is fixed to 0.8 A, the distance between the ultrasonic nozzle 6 and the substrate 1 to 15 mm, and the substrate rotational speed to 3000 rpm. As illustrated in FIG. 4, the contaminant removal rate increases as the flow rate of pure water from the ultrasonic nozzle 6 increases, and the contaminant removal rate substantially reaches its peak when the flow rate of pure water is 0.7 to 1.0 L/min.

Figure 5:
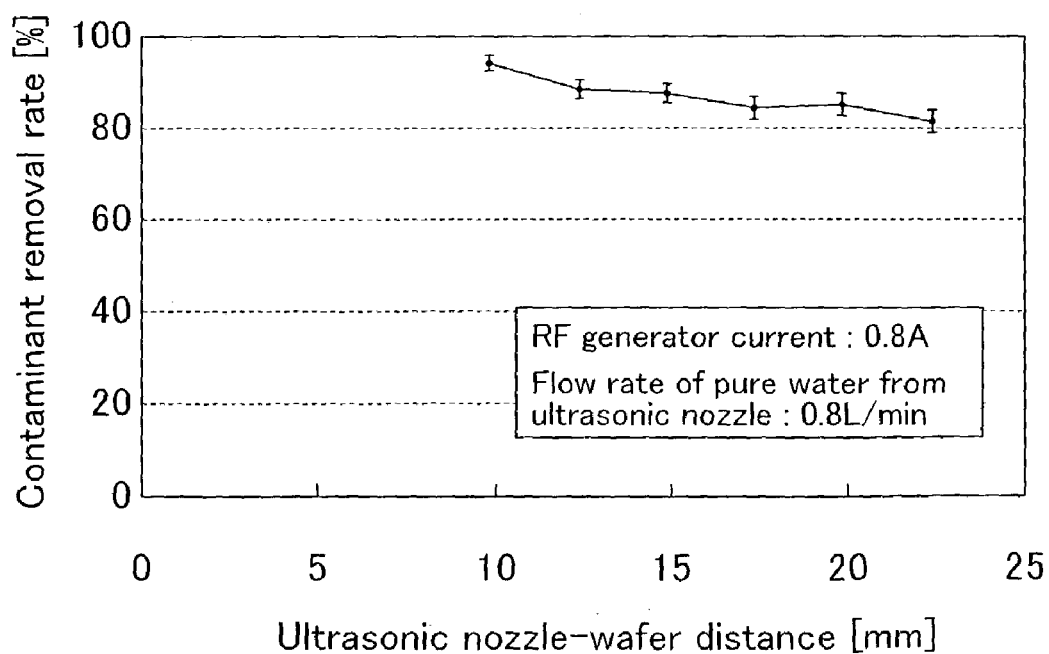
FIG. 5 is a graph illustrating the contaminant removal rate with respect to the distance between the ultrasonic nozzle and the substrate in a substrate cleaning process using the cleaning apparatus according to the first embodiment of the present invention.

FIG. 5 is a graph illustrating the contaminant removal rate with respect to the distance between the ultrasonic nozzle 6 and the substrate 1. As to parameters other than the distance between the ultrasonic nozzle 6 and the substrate 1, the output current value of the RF generator 7 is fixed to 0.8 A, the flow rate of pure water from the ultrasonic nozzle 6 to 0.8 L/min, and the substrate rotational speed to 3000 rpm. Although the contaminant removal rate tends to slightly decrease as the distance between the ultrasonic nozzle 6 and the substrate 1 increases, as illustrated in FIG. 5, the contaminant removal rate is not significantly dependent on the distance.

Figure 6:
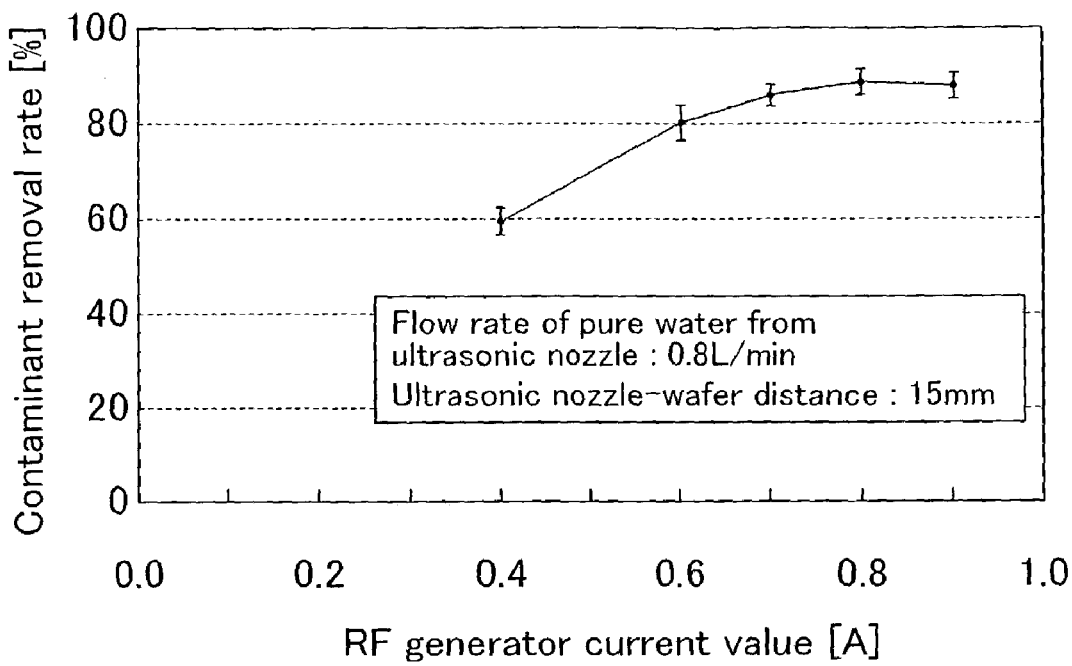
FIG. 6 is a graph illustrating the contaminant removal rate with respect to the output current value of an RF generator in a substrate cleaning process using the cleaning apparatus according to the first embodiment of the present invention.

FIG. 6 is a graph illustrating the contaminant removal rate with respect to the output current value of the RF generator 7. Herein, the output voltage value of the RF generator 7 is fixed, whereby if the output current value of the RF generator 7 increases, the output power of the RF generator 7 increases. As to parameters other than the output current value of the RF generator 7, the flow rate of pure water from the ultrasonic nozzle 6 is fixed to 0.8 L/min, the distance between the ultrasonic nozzle 6 and the substrate 1 to 15 mm, and the substrate rotational speed to 3000 rpm. As illustrated in FIG. 6, the contaminant removal rate increases as the output voltage value of the RF generator 7 increases, and the contaminant removal rate substantially reaches its peak when the output voltage value reaches 0.8 A.

The experimental data illustrated in FIG. 4 to FIG. 6 indicates that in the cleaning apparatus of the present embodiment illustrated in FIG. 1, the parameters other than the substrate rotational speed are preferably set as follows: the flow rate of pure water from the ultrasonic nozzle 6 to about 0.7 to 1.0 L/min, the distance between the ultrasonic nozzle 6 and the substrate 1 to about 10 to 20 mm, and the output current value of the RF generator 7 to about 0.8 A.

Figure 7:
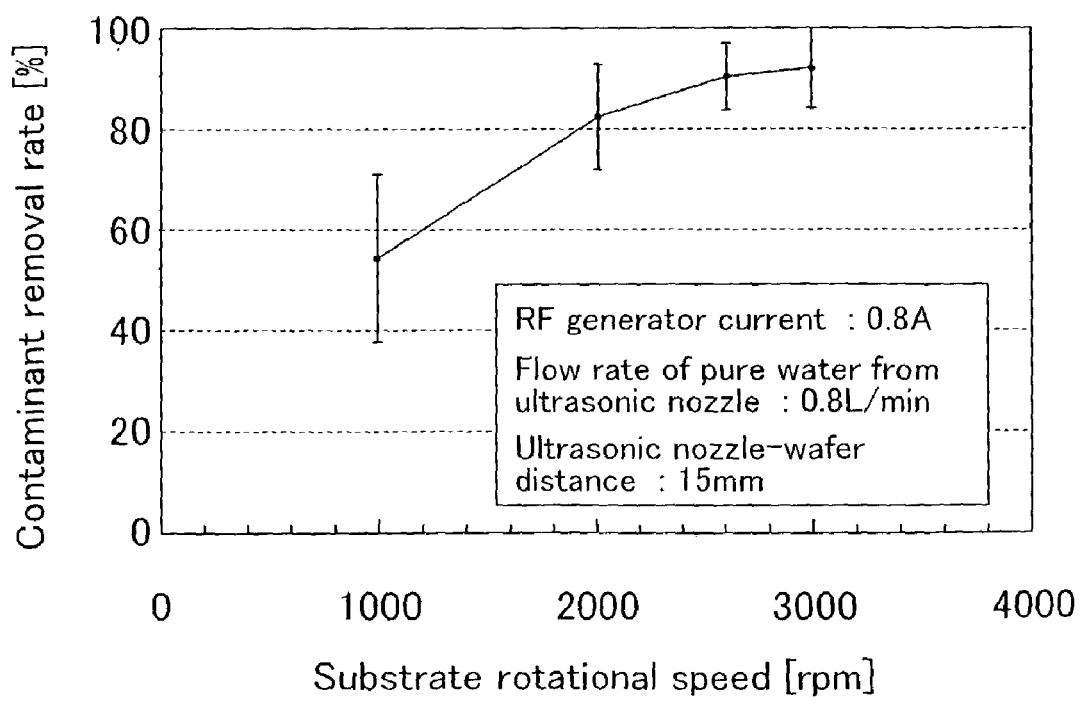
FIG. 7 is a graph illustrating the contaminant removal rate with respect to the substrate rotational speed in a substrate cleaning process using the cleaning apparatus according to the first embodiment of the present invention.

FIG. 7 is a graph illustrating the contaminant removal rate with respect to the substrate rotational speed, i.e., the rotational speed of the substrate 1 being spun by the motor 3. As to parameters other than the substrate rotational speed, the flow rate of pure water from the ultrasonic nozzle 6 is fixed to 0.8 L/min, the distance between the ultrasonic nozzle 6 and the substrate 1 to 15 mm, and the output current value of the RF generator 7 to 0.8 A. As illustrated in FIG. 7, the contaminant removal rate increases as the substrate rotational speed increases, and the contaminant removal rate is substantially saturated when the substrate rotational speed is 2600 rpm or more. This is a reason why a substrate rotational speed of 2600 rpm or more is used in the present embodiment.

Moreover, with a substrate rotational speed of about 1000 rpm used in the conventional cleaning method, the contaminant removal rate data varies substantially, as illustrated in FIG. 7, indicating some non-uniformity in the cleaning effect. Thus, the non-uniformity in the cleaning effect cannot be suppressed sufficiently only by setting the cleaning spiral pitch to be smaller than the cleaning nozzle diameter.

On the other hand, with a substrate rotational speed of 2600 rpm or more used in the present embodiment, the contaminant removal rate data does not vary substantially, as illustrated in FIG. 7, indicating that the non-uniformity in the cleaning effect is suppressed as compared with the conventional cleaning method. Thus, the contaminant removal capacity can be maximized by setting the ratio of the cleaning spiral pitch with respect to the cleaning nozzle diameter to be about 1/300 or less. More accurately, since the cleaning nozzle diameter is 4 mm and the nozzle moving velocity is 40 mm/sec in the cleaning apparatus of the present embodiment illustrated in FIG. 1, the contaminant removal capacity can be maximized by setting the ratio of the cleaning spiral pitch with respect to the cleaning nozzle diameter to be 1/260 or less, in view of the relationship: "cleaning spiral pitch=nozzle moving velocity/substrate rotational speed".

As described above, according to the first embodiment, the substrate 1 being ultrasonically cleaned is spun at a rotational speed of 2600 rpm or more. Specifically, the cleaning process is performed by supplying an ultrasonically-agitated cleaning liquid (specifically, pure water) from the ultrasonic nozzle 6 onto the substrate 1 while spinning the substrate 1 at a rotational speed that is considerably greater than that of the conventional process, which is on the order of 100 rpm. This gives the following effect. The ultrasonic vibrations, which are applied vertically to the principal surface of the substrate 1 by supplying the cleaning liquid from the ultrasonic nozzle 6, can be propagated along the principal surface of the substrate 1 toward the periphery of the substrate 1 by virtue of a strong centrifugal force. Thus, the contaminant on the substrate 1 can be washed off the substrate 1 within a short period of time, without increasing the ultrasonic output power or the number of scans made by the ultrasonic nozzle 6, whereby it is possible to achieve a high contaminant removal rate while avoiding a decrease in the manufacturing capacity and a damage to the device. Moreover, since the cleaning spiral pitch is further reduced as compared with that in a case where the conventional substrate rotational speed is used, a high contaminant removal rate can be achieved while further suppressing the number of scans made by the ultrasonic nozzle 6, i.e., while further reducing the cleaning time. Furthermore, by optimizing the ratio of the cleaning spiral pitch with respect to the cleaning nozzle diameter (specifically, by decreasing the ratio to be 1/260 or less), it is possible to clean the entire surface of the substrate 1 with the ultrasonically-vibrated cleaning liquid while maximally suppressing the non-uniformity in the cleaning effect, thereby maximizing the contaminant removal capacity.

In the first embodiment, the upper limit of the substrate rotational speed, i.e., the rotational speed of the substrate 1 being spun by the motor 3, is basically dictated by the specifications of the cleaning apparatus. However, in order to avoid situations where some contaminant particles are bounced by the cup 4, etc., back onto the substrate 1 due to a high substrate rotational speed, the substrate rotational speed is preferably 3500 rpm or less, and more preferably 3000 rpm or less. With the provision of such an upper limit on the substrate rotational speed, it is also possible to prevent the drying of the substrate 1 being cleaned.

Moreover, while a substrate rotational speed of 2600 rpm or more is used in the first embodiment, the effects of the high substrate rotational speed vary depending on the other cleaning apparatus parameters such as the nozzle diameter and the nozzle moving velocity. In view of these parameters, similar effects to those of the present embodiment can be obtained by using a substrate rotational speed of 260×V/D (rpm) or more, for example. The reason for this will now be described. Note that in the expression above, D (mm) is the diameter of the ultrasonic nozzle, and V (mm/sec) is the moving velocity of the ultrasonic nozzle.

Figure 8:
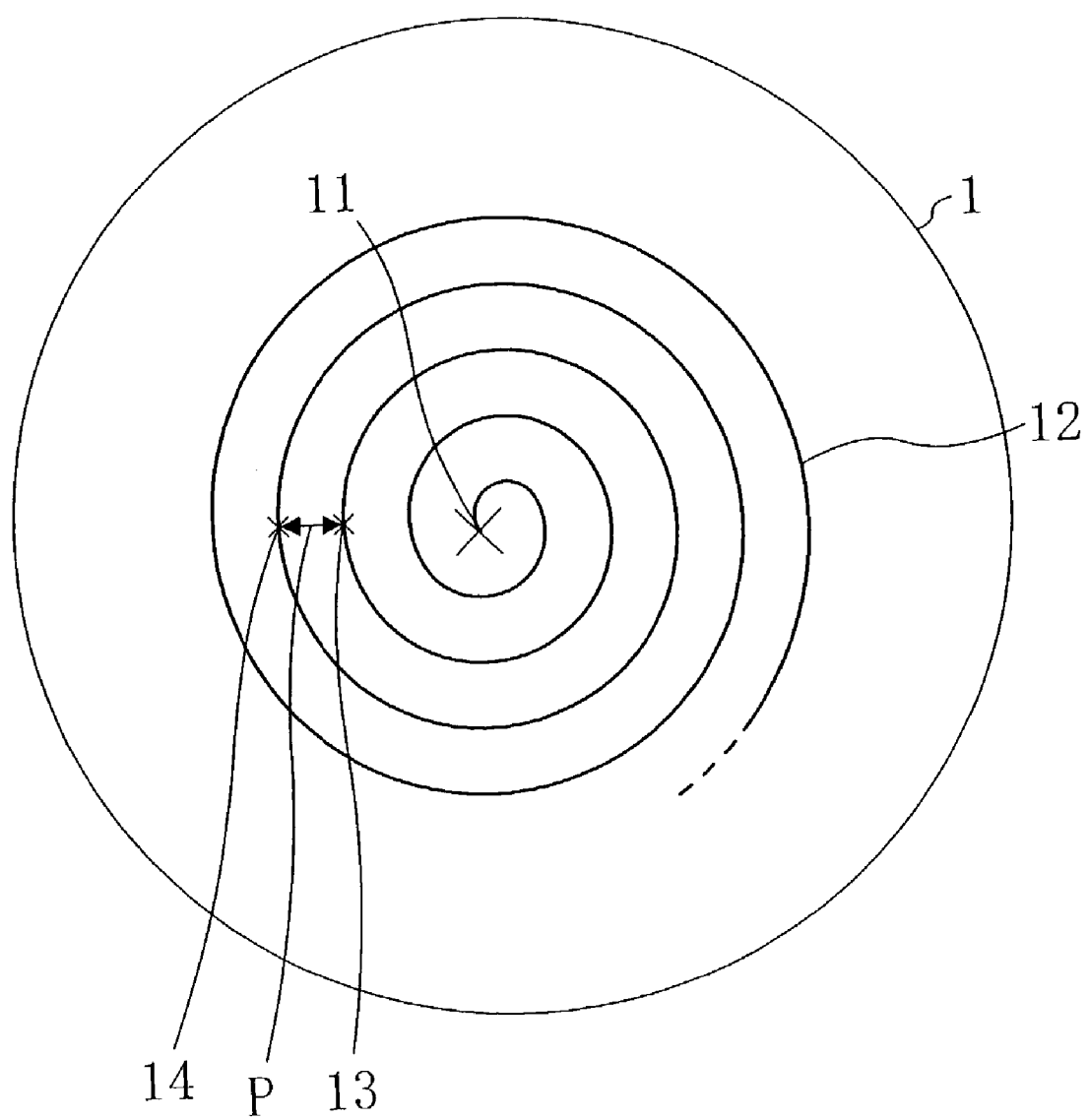
FIG. 8 is a schematic diagram illustrating the spiral trace of the ultrasonic nozzle (the trace as viewed from the spinning substrate) made while the substrate is cleaned with the cleaning apparatus according to the first embodiment of the present invention.

FIG. 8 is a schematic diagram illustrating the spiral trace of the ultrasonic nozzle 6 (the trace as viewed from the spinning substrate 1) made while the substrate 1 is cleaned with the ultrasonic cleaning apparatus of the present embodiment. In a case where the ultrasonic nozzle 6 is reciprocated above the substrate 1 between the edge position 10 and the center 11 (see FIG. 2), the ultrasonic nozzle 6 (more accurately, the center of the ultrasonic nozzle 6 being orthogonally projected onto the substrate 1) leaves a spiral trace 12 starting from (or ending at) the center 11, as illustrated in FIG. 8. Herein, the cleaning spiral pitch P is the distance between a start (or an end) 13 and an end (or a start) 14 of a single turn in the spiral. The contaminant removal capacity can be maximized when the cleaning spiral pitch P is decreased by increasing the substrate rotational speed so that the ratio of the cleaning spiral pitch P with respect to the cleaning nozzle diameter D is set to be 1/260 or less, as described above. Specifically, since cleaning spiral pitch P=nozzle moving velocity V/substrate rotational speed, the ratio of the cleaning spiral pitch P with respect to the cleaning nozzle diameter D can be set to be 1/260 or less by setting the substrate rotational speed to be 260×V/D or more, thereby maximizing the contaminant removal capacity. Note that in order to avoid problems such as the bouncing back of contaminant particles by the cup 4, etc., and the drying of the substrate 1 being cleaned, the substrate rotational speed is preferably 350×V/D or less, and more preferably 300×V/D or less.

Moreover, while pure water is used as the cleaning liquid supplied from the ultrasonic nozzle 6 onto the substrate 1 in the first embodiment, similar effects can be obtained when, for example, hydrogen water, ozone water, or the like, is used instead of pure water. Moreover, while the frequency of the ultrasonic wave to be applied to the cleaning liquid by the ultrasonic nozzle 6 is not limited to any particular frequency, the frequency of the ultrasonic wave to be applied to the cleaning liquid may be 1300 kHz or more and 1700 kHz or less, for example.

Moreover, a substrate rotational speed of 4000 rpm is used for drying the ultrasonically cleaned substrate 1 in the first embodiment, the substrate rotational speed is not limited to any particular speed as long as the drying effect is obtained. For example, a sufficient drying effect is obtained with a substrate rotational speed of 2600 rpm used in the ultrasonic cleaning process of the present embodiment. Moreover, a rotational speed of 3000 rpm or more and 5000 rpm or less, for example, may be used for drying the substrate 1, as a substrate rotational speed that can satisfy requirements in terms of both the manufacturing capacity and the mechanical strength of the cleaning apparatus.

SECOND EMBODIMENT

A substrate cleaning method and a cleaning apparatus according to the second embodiment of the present invention will now be described with reference to the drawings.

Figure 9:
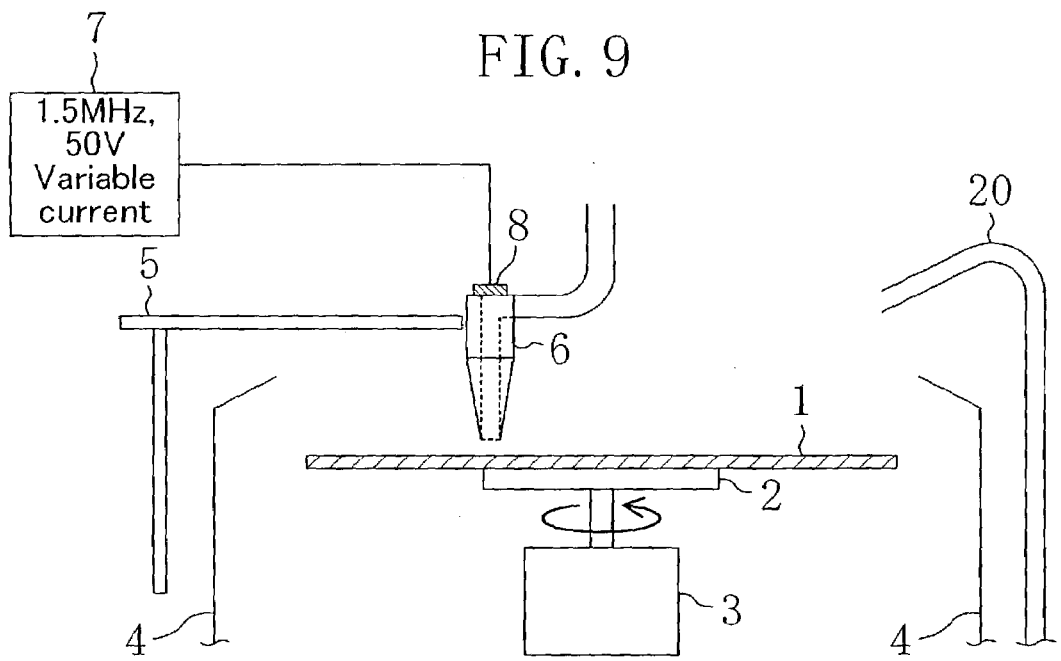
FIG. 9 is a schematic diagram illustrating the configuration of a cleaning apparatus according to a second embodiment of the present invention.

FIG. 9 is a schematic cross-sectional view illustrating a cleaning apparatus according to the second embodiment, which is an ultrasonic cleaning apparatus that cleans the substrate surface by supplying an ultrasonically-vibrated cleaning liquid thereto. Note that in FIG. 9, like elements to those of the cleaning apparatus of the first embodiment illustrated in FIG. 1 will be denoted by like reference numerals and will not be further described below.

As illustrated in FIG. 9, the cleaning apparatus of the present embodiment differs from the cleaning apparatus of the first embodiment illustrated in FIG. 1 in that a fixed nozzle 20 for supplying a cleaning liquid to the central portion of the substrate 1 is provided outside the cup 4, in addition to the ultrasonic nozzle 6. The fixed nozzle 20 is directed so that it can discharge a cleaning liquid to the center of the substrate 1.

Note that the scanning range of the ultrasonic nozzle 6 in the cleaning apparatus of the present embodiment is substantially the same as that of the ultrasonic nozzle 6 of the first embodiment illustrated in FIG. 2.

Figure 10:
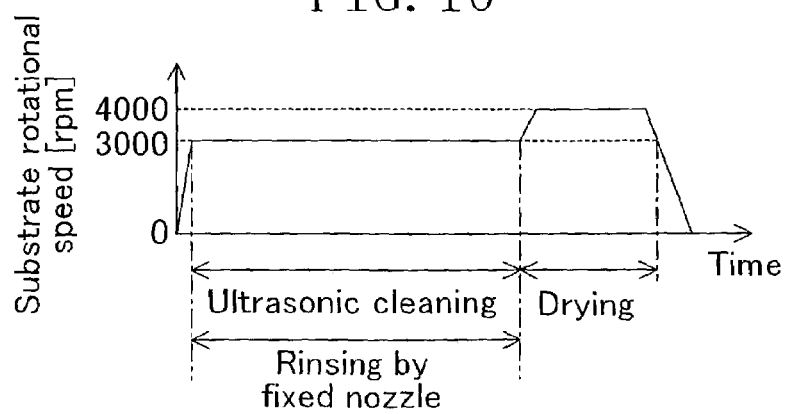
FIG. 10 is a diagram illustrating a cleaning sequence using the cleaning apparatus according to the second embodiment of the present invention.

FIG. 10 is a diagram illustrating a cleaning sequence using the ultrasonic cleaning apparatus of the present embodiment illustrated in FIG. 9.

As illustrated in FIG. 10, the cleaning sequence of the present embodiment differs from the cleaning sequence of the first embodiment illustrated in FIG. 3 in that a cleaning liquid, e.g., pure water, is supplied from the fixed nozzle 20 to the central portion of the substrate 1 at a flow rate of 0.8 L/min, for example, while the substrate 1 is ultrasonically cleaned with the ultrasonic nozzle 6. Specifically, in the cleaning sequence of the present embodiment, in addition to the ultrasonic cleaning process of the first embodiment, a rinsing process is performed with the fixed nozzle 20 while the substrate 1 is spun by the motor 3 at a rotational speed of 3000 rpm, for example.

Incidentally, with the substrate cleaning process of the first embodiment, the contaminant removal rate is about 90% at maximum (see FIG. 4 to FIG. 7). The unremoved contaminant particles remaining on the substrate 1 are localized in the central portion of the substrate 1.

In the present embodiment, a cleaning liquid is supplied from the fixed nozzle 20 to the central portion of the substrate 1 while the substrate 1 is ultrasonically cleaned with the ultrasonic nozzle 6, whereby the following effect can be obtained, in addition to those of the first embodiment. That is, it is possible to prevent the drying of the central portion of the substrate 1 being cleaned, i.e., a decrease in the contaminant removal rate in the central portion of the substrate 1, due to a substrate rotational speed as high as 2600 rpm or more. In other words, it is possible to ensure that the entire surface of the substrate 1 is always being rinsed by the cleaning liquid supplied from the fixed nozzle 20, whereby the contaminant particles deposited on the central portion of the substrate 1 can be reliably removed by the cleaning liquid. Therefore, it is possible to prevent a decrease in the contaminant removal rate in the central portion of the substrate 1 and to realize a uniform cleaning effect across the entire surface of the substrate 1.

Figure 11:
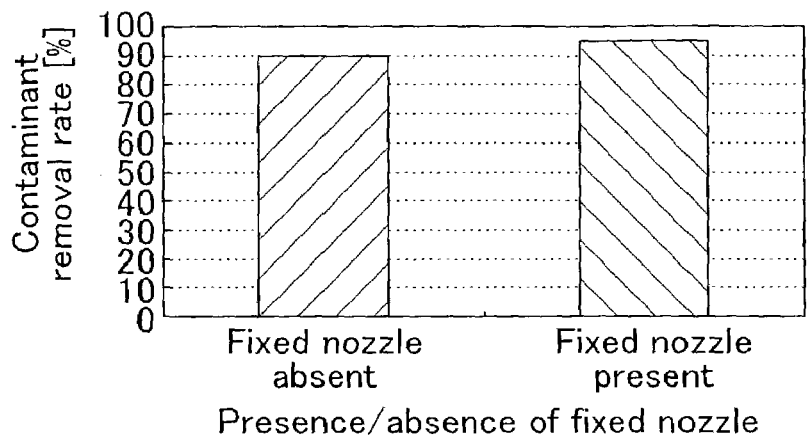
FIG. 11 is a graph illustrating the results of a comparison made between the contaminant removal rate of the cleaning apparatus according to the second embodiment of the present invention and that of a cleaning apparatus with no fixed nozzle in order to confirm the advantage of the substrate cleaning process using the cleaning apparatus of the second embodiment.

In order to confirm the advantage of the substrate cleaning process of the present embodiment using the cleaning apparatus illustrated in FIG. 9, the contaminant removal rate of the cleaning apparatus of the present embodiment was compared with that of the cleaning apparatus of the first embodiment (see FIG. 1) with no fixed nozzle 20. The results will now be described with reference to FIG. 11. Note that the contaminant removal rate was evaluated by cleaning the substrate 1 with, for example, about 4000 to 5000 silicon particles deposited thereon, and then measuring the silicon particle count on the cleaned substrate 1 so as to calculate the particle removal rate (%). Moreover, the results were all obtained under the following conditions. That is, the output frequency, the output voltage value and the output current value of the RF generator 7 were 1.5 MHz, 50 V and 0.8 A, respectively, the flow rate of pure water from the ultrasonic nozzle 6 was 0.8 L/min, the distance between the ultrasonic nozzle 6 and the substrate 1 was 15 mm, and the substrate rotational speed was 3000 rpm. As illustrated in FIG. 11, with the substrate cleaning process of the present embodiment using the fixed nozzle 20, the contaminant removal rate improves about 5%, as compared with that obtained when the fixed nozzle 20 is not used.

Note that while pure water is used as the cleaning liquid supplied from the fixed nozzle 20 to the central portion of the substrate 1, similar effects can be obtained when, for example, hydrogen water, ozone water, or the like, is used instead of pure water. Moreover, the type of the cleaning liquid supplied from the ultrasonic nozzle 6 may be the same as, or different from, the type of the cleaning liquid supplied from the fixed nozzle 20.

THIRD EMBODIMENT

A substrate cleaning method and a cleaning apparatus according to the third embodiment of the present invention will now be described with reference to the drawings.

Note that the basic configuration and the cleaning sequence of the cleaning apparatus of the present embodiment are substantially the same as the basic configuration (see FIG. 1) and the cleaning sequence (see FIG. 3), respectively, of the cleaning apparatus of the first embodiment, and will not be further described below.

Figure 12:
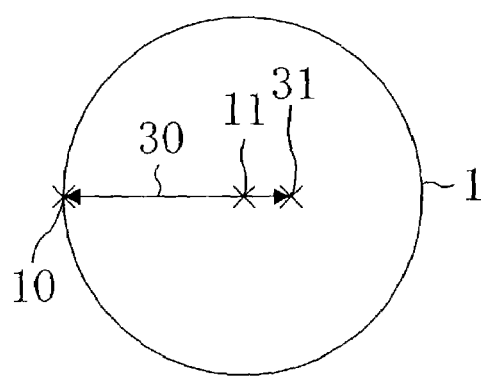
FIG. 12 is a schematic plan view illustrating the scanning range of an ultrasonic nozzle in a cleaning apparatus according to a third embodiment of the present invention.

FIG. 12 is schematic plan view illustrating the scanning range of the ultrasonic nozzle 6 (hereinafter referred to as "nozzle scanning range") in the ultrasonic cleaning apparatus of the present embodiment.

As illustrated in FIG. 12, the nozzle scanning range of the present embodiment differs from the nozzle scanning range of the first embodiment illustrated in FIG. 2 as follows. As illustrated in FIG. 2, the nozzle scanning range 9 of the first embodiment is set so as to extend in the radial direction between the edge position 10 and the center 11 of the substrate, which is a wafer. Thus, the ultrasonic nozzle 6 is reciprocated above the substrate 1 between the edge position 10 and the center 11. In contrast, a nozzle scanning range (a range across which the ultrasonic nozzle 6 is moved) 30 of the third embodiment is set so as to extend in the radial direction between the edge position 10 and a position 31 past the center 11 by a predetermined distance (e.g., about 10 to 20 mm) above the substrate 1, as illustrated in FIG. 12. In other words, in the third embodiment, the ultrasonic nozzle 6 is reciprocated above the substrate 1 across the center 11 of the substrate 1 between the edge position 10 of the substrate 1 and the position 31 past the center 11 of the substrate 1 by a predetermined distance (hereinafter referred to as "overlap distance").

Note that the ultrasonic nozzle 6 may be reciprocated above the substrate 1 between the edge position 10 and the position 31 while leaving a straight trace (see FIG. 12) or an arched trace, for example.

Incidentally, with the substrate cleaning process of the first embodiment, the contaminant removal rate is about 90% at maximum (see FIG. 4 to FIG. 7). The unremoved contaminant particles remaining on the substrate 1 are localized in the central portion of the substrate 1.

In contrast, in the present embodiment, the scanning range 30 of the ultrasonic nozzle 6 has an overlap of about 10 to 20 mm in the central portion of the substrate 1, whereby the following effect can be obtained, in addition to those of the first embodiment. That is, the cleaning time per one scan by the ultrasonic nozzle 6 is increased in the central portion of the substrate 1 being cleaned (an area within about 10 to 20 mm from the center of the substrate 1). Thus, even in the central portion of the substrate 1 where the revolution velocity (=rotational speed×distance from substrate center) is smaller than in the peripheral portion of the substrate 1, it is possible to increase the efficiency of moving the contaminant toward the periphery of the substrate (in the horizontal direction). Thus, it is possible to prevent a decrease in the contaminant removal rate in the central portion of the substrate 1 and to realize a uniform cleaning effect across the entire surface of the substrate 1.

In order to confirm the advantage of the substrate cleaning process of the present embodiment using the nozzle scanning range 30 as illustrated in FIG. 12 (specifically, a range extending from the edge of the substrate to a position past the center of the substrate by 20 mm), the contaminant removal rate of the substrate cleaning process of the present embodiment was compared with that of the substrate cleaning process of the first embodiment using the nozzle scanning range 9 as illustrated in FIG. 2 (specifically, a range extending from the edge of the substrate to the center of the substrate). The results will now be described with reference to FIG. 13. Note that the contaminant removal rate was evaluated by cleaning the substrate 1 with, for example, about 4000 to 5000 silicon particles deposited thereon, and then measuring the silicon particle count on the cleaned substrate 1 so as to calculate the particle removal rate (%).

Figure 13:
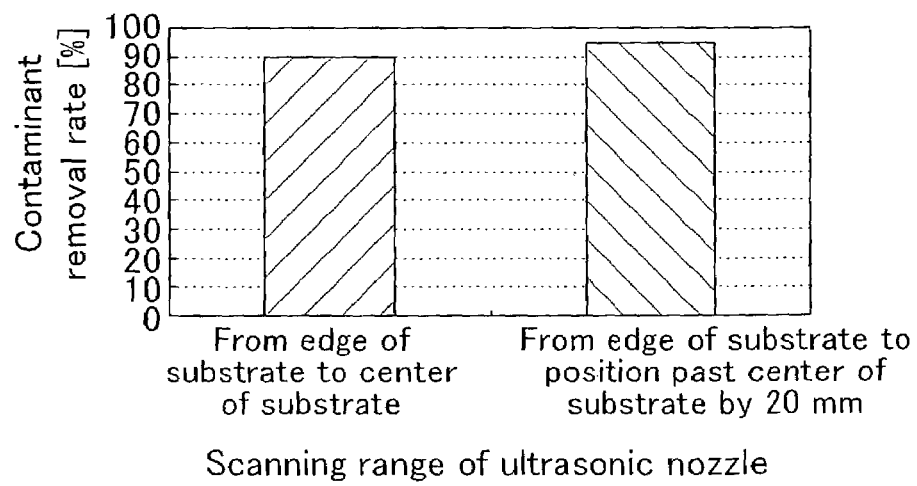
FIG. 13 is a graph illustrating the results of a comparison made between the contaminant removal rate of a substrate cleaning process using the scanning range of the ultrasonic nozzle in the cleaning apparatus according to the third embodiment of the present invention and that of a substrate cleaning process in which the nozzle scanning range has no overlap in a central portion of the substrate in order to confirm the advantage of the substrate cleaning process of the third embodiment.
Figure 14:
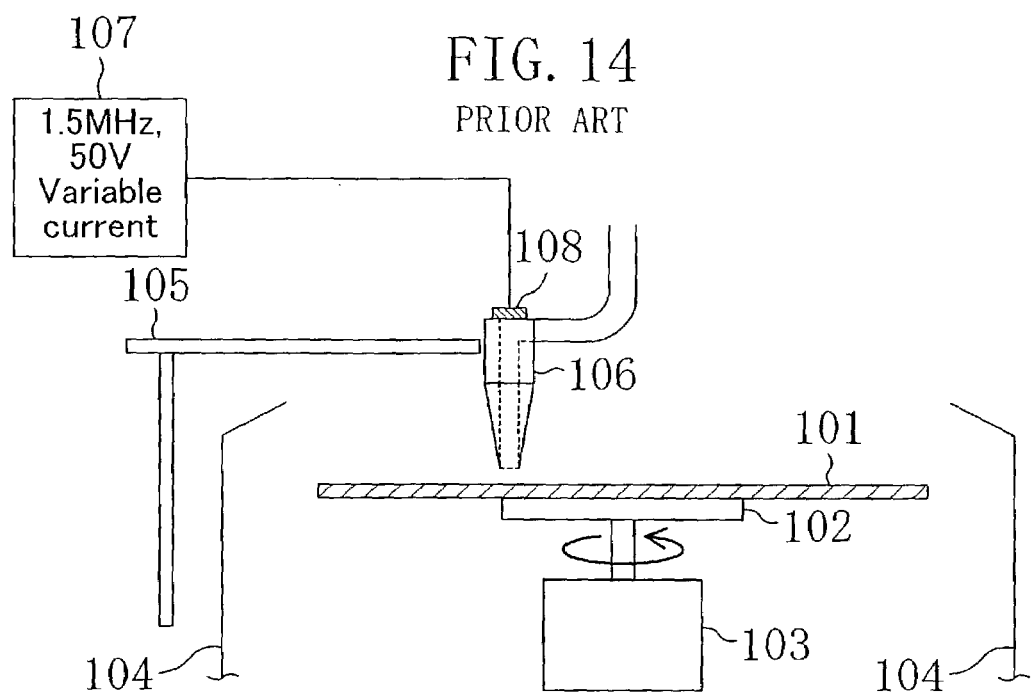
FIG. 14 is a schematic diagram illustrating the configuration of a conventional ultrasonic cleaning apparatus.
Figure 15:
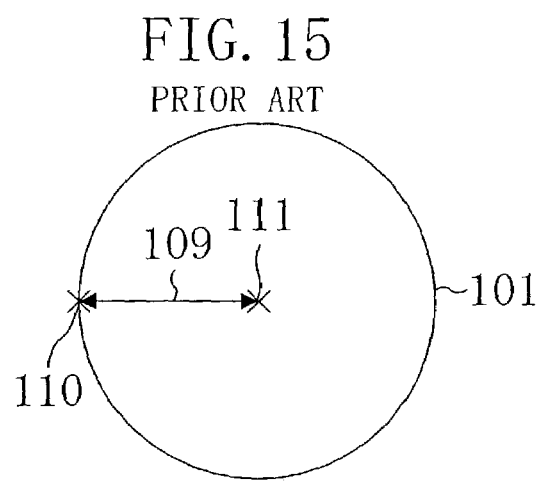
FIG. 15 is a schematic plan view illustrating the scanning range of an ultrasonic nozzle in the conventional ultrasonic cleaning apparatus.
Figure 16:
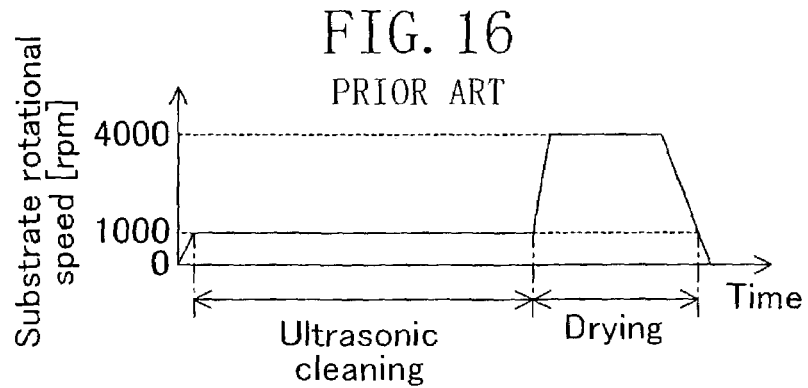
FIG. 16 is a diagram illustrating a cleaning sequence using the conventional ultrasonic cleaning apparatus.

Moreover, the results were all obtained under the following conditions. That is, the output frequency, the output voltage value and the output current value of the RF generator 7 were 1.5 MHz, 50 V and 0.8 A, respectively, the flow rate of pure water from the ultrasonic nozzle 6 was 0.8 L/min, the distance between the ultrasonic nozzle 6 and the substrate 1 was 15 mm, and the substrate rotational speed was 3000 rpm. By setting the scanning range 30 of the ultrasonic nozzle 6 so as to extend from the edge position 10 of the substrate 1 to a position 31 past the center 11 by 20 mm, the contaminant removal rate improves by about 5%, as compared with that obtained when the nozzle scanning range has no overlap in the central portion of the substrate 1, as illustrated in FIG. 13.

Note that while the overlap distance of the ultrasonic nozzle 6 in the central portion of the substrate 1 is not limited to any particular value in the third embodiment, the following effect can be obtained by setting the overlap distance to be 10 mm or more and 20 mm or less (or 10% or more and 20% or less of the radius of the wafer to be the substrate 1). That is, it is possible to suppress an increase in the cleaning time, i.e., a decrease in the device manufacturing capacity, as compared with a case where the contaminant removal rate is improved by increasing the number of scans made by the ultrasonic nozzle 6.

Moreover, a cleaning apparatus and a cleaning sequence that are substantially the same as those of the first embodiment are used in the third embodiment. In other words, the substrate 1 being ultrasonically cleaned is spun at a rotational speed of 2600 rpm or more. However, even in a case where the substrate 1 being ultrasonically cleaned is spun at a rotational speed below 2600 rpm, it is possible to obtain the effects of the present embodiment as described above (i.e., the effect of preventing a decrease in contaminant removal rate in the substrate central portion, and the effect of suppressing the decrease in the device manufacturing capacity), as compared with a case where the nozzle scanning range has no overlap in the central portion of the substrate 1.

Moreover, in the third embodiment, a cleaning apparatus substantially the same as that of the second embodiment (see FIG. 9) may be used instead of a cleaning apparatus substantially the same as that of the first embodiment. In other words, the fixed nozzle 20 for supplying a cleaning liquid to the central portion of the substrate 1 may be provided, in addition to the ultrasonic nozzle 6, so as to supply a cleaning liquid from the fixed nozzle 20 to the central portion of the substrate 1 while the substrate 1 is ultrasonically cleaned with the ultrasonic nozzle 6. In this way, even if a substrate rotational speed as high as 2600 rpm or more is used, it is possible to more reliably prevent the drying of the central portion of the substrate 1 being cleaned, i.e., a decrease in the contaminant removal rate in the central portion of the substrate 1.

What is claimed is:

1. A substrate cleaning method for cleaning a substrate by supplying an ultrasonically-agitated cleaning liquid onto the substrate from a nozzle provided above the substrate while spinning the substrate,
wherein when the cleaning liquid is supplied from the nozzle onto the substrate, the nozzle is reciprocated above the substrate from an edge position of the substrate through a center of the substrate to a position that is past the center of the substrate by a predetermined distance, and the predetermined distance is 10% or more and 20% or less of a radius of a wafer to be the substrate, wherein preventin a decrease in contaminant removal rate in the substrate central portion is effected.

2. The substrate cleaning method of claim 1, wherein the substrate being cleaned is spun at a rotational speed of 2600 rpm or more and 3000 rpm or less.

3. The substrate cleaning method of claim 1, wherein while the cleaning liquid is supplied onto the substrate from the nozzle, another cleaning liquid is supplied to a central portion of the substrate from another fixed nozzle so as to prevent drying of the central portion of the substrate being cleaned.

4. The substrate cleaning method of claim 1, wherein the predetermined distance is 10 mm or more and 20 mm or less.

5. The substrate cleaning method of claim 1, wherein after cleaning said substrate using said ultrasonically agitated cleaning liquid, said substrate is dried by spinning said substrate at the same speed as during cleaning.

6. The substrate cleaning method of claim 1,
wherein the substrate being cleaned is spun at a rotational speed that is determined based on 260×V/D (rpm) or more and 350×V/D (rpm) or less, where D (mm) is a diameter of the nozzle and V (mm/sec) is a moving velocity of the nozzle.

7. The substrate cleaning method of claim 6, wherein the substrate being cleaned is spun at a rotational speed that is determined based on 260×V/D (rpm) or more and 300×V/D (rpm) or less.

8. The substrate cleaning method of claim 6, wherein while the cleaning liquid is supplied onto the substrate from the nozzle, another cleaning liquid is supplied to a central portion of the substrate from another fixed nozzle so as to prevent drying of the central portion of the substrate being cleaned.

9. The substrate cleaning method of claim 6, wherein after cleaning said substrate using said ultrasonically agitated cleaning liquid, said substrate is dried by spinning said substrate at the same speed as during cleaning.

10. The substrate cleaning method of claim 1, wherein the substrate being cleaned is spun at a rotational speed of 2600 rpm or more and 3500 rpm or less.

11. A substrate cleaning method for cleaning a substrate by supplying an ultrasonically-agitated water based cleaning liquid onto the substrate from a nozzle provided above the substrate while spinning the substrate,
wherein the substrate being cleaned is spun at a rotational speed of 2600 rpm or more and 3500 rpm or less,
while the cleaning liquid is supplied onto the substrate from the nozzle, another cleaning liquid is supplied to a central portion of the substrate from another fixed nozzle so as to prevent drying of the central portion of the substrate being cleaned,
the nozzle is reciprocated above the substrate from an edge position of the substrate through a center of the substrate to a position that is past the center of the substrate by a predetermined distance, and
the predetermined distance is 10% or more and 20% or less of a radius of a wafer to be the substrate, wherein preventing a decrease on contaminant removal rate in the substrate central portion is effected.

12. The substrate cleaning method of claim 11, wherein the substrate being cleaned is spun at a rotational speed of 2600 rpm or more and 3000 rpm or less.

13. The substrate cleaning method of claim 11, wherein the predetermined distance is 10 mm or more and 20 mm or less.

* * * * *